United States Patent
Subramanian et al.

(10) Patent No.: US 7,309,659 B1
(45) Date of Patent: Dec. 18, 2007

(54) SILICON-CONTAINING RESIST TO PATTERN ORGANIC LOW K-DIELECTRICS

(75) Inventors: Ramkumar Subramanian, Sunnyvale, CA (US); Calvin T. Gabriel, Cupertino, CA (US); Bhanwar Singh, Morgan Hill, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 375 days.

(21) Appl. No.: 11/097,029

(22) Filed: Apr. 1, 2005

(51) Int. Cl.
*H01L 21/31* (2006.01)
*H01L 21/469* (2006.01)

(52) U.S. Cl. ............... 438/763; 438/778; 257/E21.035; 257/E21.037

(58) Field of Classification Search ............... 977/890; 438/763, 778, 793, 725, 794; 257/E21.035, 257/E21.037
See application file for complete search history.

(56) References Cited

U.S. PATENT DOCUMENTS

| | | |
|---|---|---|
| 4,751,170 A | 6/1988 | Mimura et al. |
| 4,931,351 A | 6/1990 | McGolgin et al. |
| 5,407,786 A | 4/1995 | Ito et al. |
| 5,427,649 A | 6/1995 | Kim et al. |
| 5,486,424 A | 1/1996 | Nakato et al. |
| 5,688,723 A | 11/1997 | Okamoto et al. |
| 5,707,783 A | 1/1998 | Stauffer et al. |
| 5,877,075 A | 3/1999 | Dai et al. |
| 6,190,837 B1 | 2/2001 | Jung et al. |
| 6,451,512 B1 | 9/2002 | Rangarajan et al. |
| 2005/0214694 A1* | 9/2005 | Hong et al. ............ 430/323 |
| 2006/0024951 A1* | 2/2006 | Schuehrer et al. ....... 438/627 |

FOREIGN PATENT DOCUMENTS

| | | |
|---|---|---|
| EP | 394 739 | 4/1990 |
| EP | 886 185 | 12/1998 |
| JP | 406150031 | * 5/1994 |
| JP | 2004038142 | * 2/2004 |
| WO | WO 97/33199 | 9/1997 |

OTHER PUBLICATIONS

International Search Report for PCT/US01/12897 dated May 13, 2002.

* cited by examiner

*Primary Examiner*—Caridad M. Everhart
(74) *Attorney, Agent, or Firm*—Amin, Turocy & Calvin, LLP (57) ABSTRACT

The disclosure provides methods to mitigate and/or eliminate problems associated with removal of carbon-based resists from organic low k dielectrics. The methods include forming an organic low k dielectric layer over a semiconductor substrate, forming a capping layer over the organic low k dielectric layer, forming a silicon-containing resist over the capping layer, patterning the silicon-containing resist layer to expose portions of the capping layer and to form a patterned silicon oxide layer, removing the organic low k dielectric layer to form one or more openings, and removing the patterned silicon oxide layer. The silicon-containing resist facilitates efficient patterning of the organic low k-dielectric layers, and thereby increases the performance and cost-effectiveness of semiconductor devices fabricated using organic low k dielectrics.

20 Claims, 9 Drawing Sheets

SILICON-CONTAINING RESIST TO PATTERN ORGANIC LOW K-DIELECTRICS

FIELD OF INVENTION

The subject invention relates generally to semiconductor fabrication techniques, and more particularly to using silicon-containing resists to pattern organic low k-dielectrics.

BACKGROUND OF THE INVENTION

Continuing demand for smaller and lighter electronics has created a need for advanced materials and designs. This is because current trends in electronic markets, such as the growing demand for wireless communications and portable computing, are placing an increasing emphasis on smaller/lighter device features and faster operating speeds. To ensure reliable operation of an electronic circuit, proper electrical isolation between adjacent conductors must be achieved. Proper electrical isolation mitigates high voltage arcing and leakage currents, which can be exacerbated at high frequencies. As device density on chips increases, the difficulty in achieving proper electrical isolation also increases.

As the wafer size increases and/or as transistor device size decreases, concerns over the interlayer dielectric material become more important. Current interlayer dielectric materials, such as inorganic oxides and nitrides, have beneficial aspects as well as deficiencies. It is more important to account for certain physical properties, such as unwanted diffusion, crosstalk, adequate insulation (both electrical and temperature), coefficients of thermal expansion, short channel effects, leakage, critical dimension control, drain induced barrier lowering, and the like, when making circuit designs.

Thus, there is a need in the art for materials that provide better insulation, and methods and systems for integrating those materials into the fabrication processes of semiconducting devices.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention relates to methods for fabricating semiconductor devices wherein a silicon-containing resist is employed to mitigate difficulties associated with removal of carbon-containing resists from organic low k dielectric materials. The subject invention improves the usefulness of organic low k dielectrics in the manufacture of semiconductor devices.

According to one aspect of the subject invention, methods are provided that improve patterning of organic low k dielectrics. The methods include forming an organic low k dielectric layer over a semiconductor substrate, forming a capping layer over the organic low k dielectric layer, forming a silicon-containing resist over the capping layer, patterning the silicon-containing resist layer to expose portions of the capping layer and to form a patterned silicon oxide layer, removing the exposed portions of the capping layer and corresponding portions of the organic low k dielectric layer underlying the exposed portions of the capping layer to form one or more openings, and removing the patterned silicon oxide layer.

According to another aspect of the subject invention, methods are provided to fabricate damascene interconnect structures using organic low k dielectrics. The methods include forming an organic low k dielectric layer over a semiconductor substrate, forming a capping layer over the organic low k dielectric layer, forming a silicon-containing resist layer over the capping layer, patterning the silicon-containing resist layer to expose portions of the capping layer and to form a patterned silicon oxide layer, removing the exposed portions of the capping layer and corresponding portions of the organic low k dielectric layer underlying the exposed portions of the capping layer to form one or more openings, removing the patterned silicon oxide layer, filling the openings with a conductive material, and polishing the conductive material to form a damascene structure.

According to yet another aspect of the subject invention, methods are provided for improved fabrication of dual damascene interconnect structures using organic low k dielectrics. The methods involve forming silicon-containing resist layers over underlying capping and organic low k dielectric layers, patterning of silicon-containing resist layers to expose portions of underlying layers and to form patterned silicon oxide layers, forming via and trench openings in the organic low k dielectric layers, and removing the patterned silicon oxide layers without adversely affecting the organic low k dielectric layers. The methods advantageously use patterned silicon oxide layers as a mask to form via and trench openings in the underlying layers.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of a few of the various ways in which the principles of the invention may be employed. Other objects, advantages and novel features of the invention will become apparent from the following detailed description of the invention when considered in conjunction with the drawings.

DISCLOSURE OF THE INVENTION

The subject invention relates to the integration of organic low k dielectrics into the manufacture of semiconducting devices. The subject invention can be advantageously employed in the fabrication of multilevel interconnects, interlayer dielectrics, passivation layers, and the like. The subject invention involves using an oxidized silicon-containing resist to pattern organic low k dielectrics. The subject invention significantly mitigates and/or eliminates problems associated with the use of carbon-containing resists in patterning organic low k dielectrics. Thus, the subject invention provides for manufacture of semiconducting devices, such as memory chips and semiconductor chips that exhibit one or more of the following advantages: light in weight, semiflexible in constitution, high electrical performance, high density, increased reliability, high durability, small size, and low cost.

The inventors have observed that it is often difficult to remove carbon-containing resists from organic low k dielectric materials without adversely affecting organic low k dielectric layers. Any resist that remains on the dielectric can affect subsequent processing, and may ultimately compromise performance of semiconductor structures by degrading pattern integrity.

The inventors of the subject invention have discovered that the use of a silicon-containing resist can significantly improve patterning and etching of organic low k dielectrics. After or during patterning using silicon-containing resist, the silicon in the silicon-containing resist can be oxidized to form a silicon oxide, which then can serve as an etch mask. Etching procedures used to etch organic low k dielectric layers do not significantly affect silicon oxide. Similarly, etching conditions employed to remove silicon oxide do not significantly affect low k dielectrics. Thus, the subject invention advantageously provides methods to improve the integration of organic low k dielectrics into the manufacture of semiconductor devices.

The subject invention, typically, involves forming an organic low k dielectric layer over a semiconductor substrate, forming a capping layer over the organic low k dielectric layer, forming a silicon-containing resist layer over the capping layer, patterning the silicon-containing resist layer to expose portions of the capping layer and to form a patterned silicon oxide layer, etching the exposed portions of the capping layer to further expose portions of the organic low k dielectric layer, and removing the patterned silicon oxide layer.

Organic low k dielectrics can be any carbon containing dielectric compounds. Organic low k dielectrics can be either small organic compounds or organic polymers. For example, organic low k dielectrics of the subject invention can be either fluorinated organic polymers or non-fluorinated organic polymers. Examples of organic low k dielectric include polyimides, fluorinated polyimides, methyl polysilsequioxanes, butyl polysilsequioxanes, and phenyl polysilsequioxanes, benzocyclobutenes (BCB), fluorinated benzocyclobutene, polyphenylene, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fliorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, polymeric photoresist materials, phenolics, polycarbonates, polyesters, polyolefins, polyvinylidinefluoride, and the like.

Specific examples of commercially available organic low k dielectrics include those under the trade designations FLARE™ from AlliedSignal, believed to be derived from perfluorobiphenyl and aromatic bisphenols; Black Diamond™ from Applied Materials; CYTOP fluoropolymer and ALCAP-S from Asahi Chemical; SiLK® and CYCLOTENE® BCB from Dow Chemical; KAPTON® polyimides and IMIDEX® polyimides available from DuPont; ZION from Shipley; TEFLON® polytetrafluoroethylene from DuPont; XLK and 3MS from Dow Corning; HSG RZ25 from Hitachi Chemical; HOSP™ and NANOGLASS™ from Honeywell Electronic Materials; LKD from JSR Microelectronics; CORAL™ and AF4 from Novellus; and VELOX™ PAE-2 from Schumacher.

Organic low k dielectrics are typically formed using either spin-on or chemical vapor deposition (CVD) techniques. CVD includes pulsed plasma enhanced chemical vapor deposition (PECVD) and pyrolytic CVD as well as continuous PECVD. For example, plasma polymerization is a common method for depositing fluorocarbon organic low k dielectrics. PECVD uses continuous radio frequency (rf) power to excite the precursor gases in order to deposit films within the glow discharge region.

The capping layer of the subject invention can be formed using any suitable material. Examples of capping layer materials include silicon nitride, silicon oxynitride, and the like. A capping layer serves to offset the high intrinsic stress within low k dielectrics. Further, a capping layer protects organic low k dielectric layer during patterning.

The silicon-containing resist of the subject invention can be any silicon-containing resist. Silicon-containing resists have silicon atoms within a polymer backbone, whereas most other resists have backbones that are substantially carbon. Silicon-containing resists include a polysiloxane and a silsesquioxane. Polysiloxanes have the repeating unit shown in Formula 1

Polsiloxane

Formula 1 wherein $R^1$ and $R^2$ are independently a hydrogen alkyl group having about 1 to about 6 carbon atoms, a fluoroalkyl group having about 1 to about 6 carbon atoms, a norbornene group having about 8 to about 20 carbon atoms, or an aromatic group having about 6 to about 12 carbon atoms. Silsesquioxanes have the repeating unit shown in Formula 2

Silsesquioxane

Formula 2 wherein $R^3$ and $R^4$ are independently a hydrogen alkyl group having about 1 to about 6 carbon atoms, a fluoroalkyl group having about 1 to about 6 carbon atoms, a norbornene group having about 8 to about 20 carbon atoms, or an aromatic group having about 6 to about 12 carbon atoms Silicon-containing resists can be formed using techniques such as CVD, PECVD, evaporation, spin-on coating, and the like. The silicon-containing resist can be patterned utilizing light to irradiate a portion of the silicon-containing resist, and a developer to remove the irradiated portion or non-irradiated portion of the silicon-containing resist to expose portions of a capping layer.

Either during or after patterning, the silicon in either the non-irradiated or irradiated portions of a silicon-containing resist can be oxidized to form a patterned silicon oxide layer. Using the patterned silicon oxide layer as a mask the exposed portions of a capping layer can be removed to further expose portions of an underlying organic low k dielectric layer. Subsequently, the exposed portions of the organic low k dielectric layer are removed via contacting an oxygen plasma. Subsequently, the patterned silicon oxide layer is removed using either etching or polishing. During removal or stripping of the patterned silicon oxide layer, a portion of the capping layer may also be lost.

The subject invention provides methods for forming improved low k insulation layers, such as between metal lines (as an interlayer dielectric) and between metal layers (as an interlevel dielectric). The subject invention may be better understood and its advantages appreciated in conjunction with figures, and drawings, wherein like numerals represent like features throughout.

Figure 1:
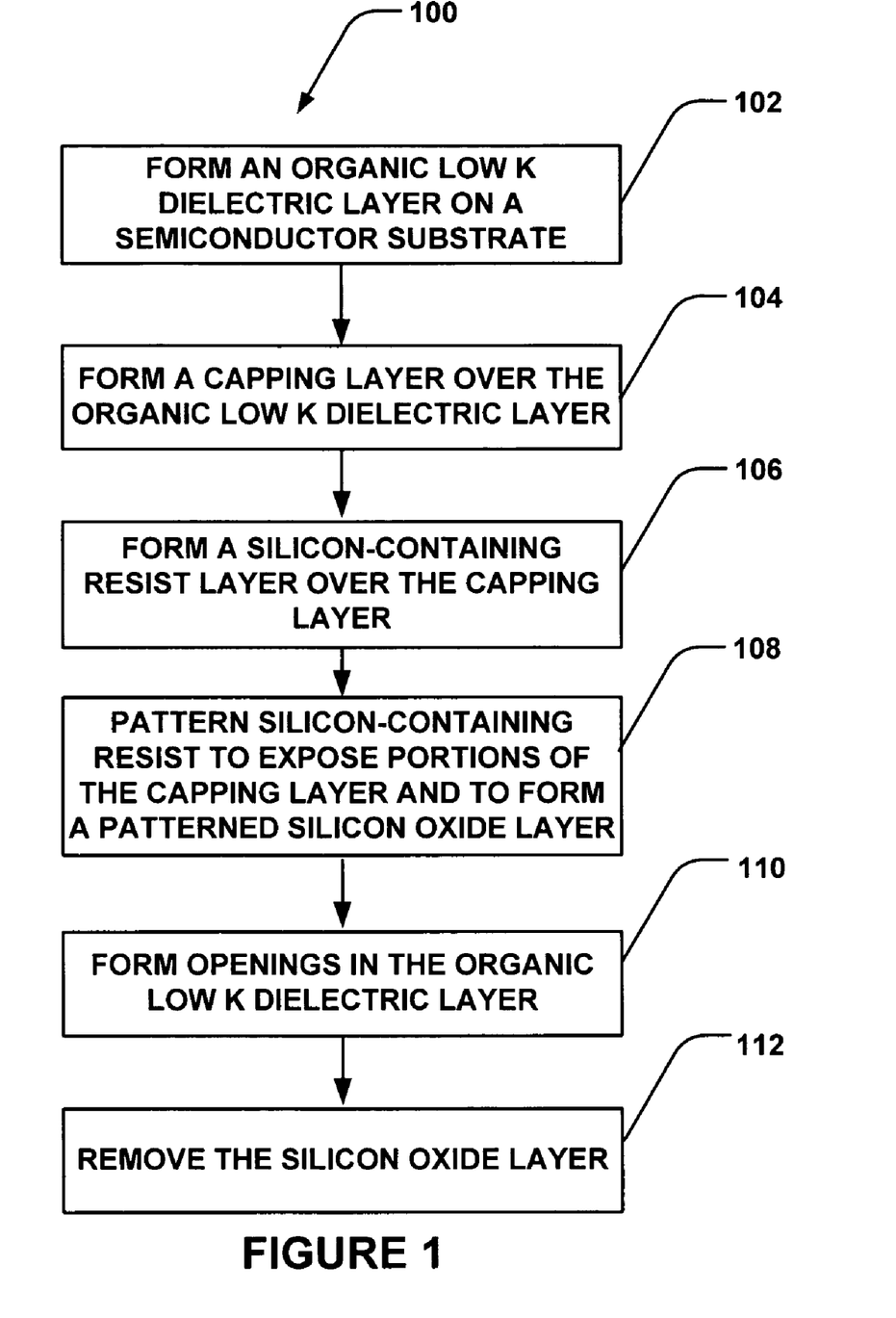
FIG. 1 is a flow chart depicting an exemplary methodology carried out to pattern an organic low k dielectric layer according to one aspect of the subject invention.

Referring initially to FIG. 1, an exemplary methodology 100 for patterning an organic low k dielectric material is illustrated in accordance with an aspect of the subject invention. For simplicity of explanation, the methodologies are depicted and described as a series of acts. It is to be understood and appreciated that the subject invention is not limited by the acts illustrated and/or by the order of acts, for example acts can occur in various orders and/or concurrently, and with other acts not presented and described herein. Furthermore, not all illustrated acts may be required to implement the methodologies in accordance with the subject invention. In addition, those skilled in the art will understand and appreciate that the methodologies could alternatively be represented as a series of interrelated states via a state diagram or events.

Method 100 involves forming an organic low k dielectric material over a semiconductor substrate (act 102), forming a capping layer over the organic low k dielectric layer (act 104), forming a silicon-containing resist layer over the capping layer (act 106), patterning the silicon-containing resist to expose portions of the capping layer and to form a patterned silicon oxide layer (act 108), forming one or more openings by removing the exposed portions of the capping layer and corresponding portions of the organic low k dielectric layer underlying the exposed portions of the capping layer (act 110), and removing the patterned silicon oxide layer (act 112).

Figure 2:
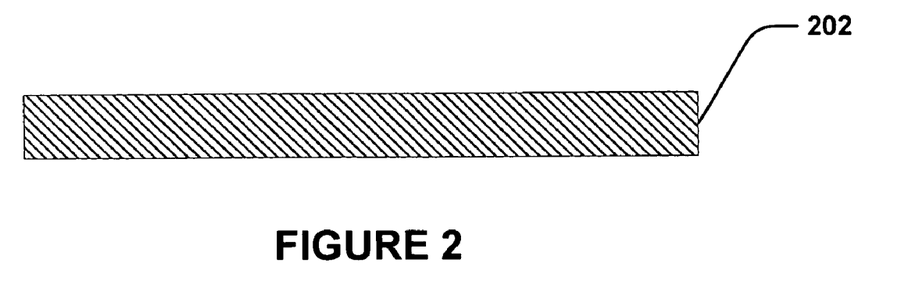
FIGS. 2-8 illustrate cross sectional views of a semiconductor substrate undergoing fabrication according to one aspect of the subject invention.

Act 102 of method 100 is forming an organic low k dielectric material over a semiconductor substrate. The substrate for act 102 can be any substrate used in the course of semiconductor processing or any semiconductor surface. FIG. 2 shows a cross sectional view of an exemplary substrate 202 prepared for carrying out act 102. The substrate 202 can be formed using methods known to one skilled in the art. Examples of substrate 202 include semiconductor materials such as gallium arsenide (GaAs), germanium, silicon, silicon germanium, lithium niobate, and compositions containing silicon such as crystalline silicon, polysilicon, amorphous silicon, epitaxial silicon, silicon oxide ($SiO_2$), and mixtures thereof. Typically, the substrate 202 is a silicon substrate, optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

An organic low k dielectric layer can be formed over the substrate 202. The subject invention can use any suitable organic low k dielectric material. For purposes of this invention, organic low k dielectric materials have a dielectric constant below about 3.5. In another embodiment, organic low k dielectric materials have a dielectric constant below about 2.4. In yet another embodiment, organic low k materials have a dielectric constant below about 1.8. In still yet another embodiment, organic low k materials have a dielectric constant below about 1.5.

Examples of organic low k dielectrics are listed above. In one embodiment of the subject invention, fluorinated organic polymers can be used as organic low k dielectric materials. In another embodiment of the invention, non-fluorinated organic polymers can be used as organic low k dielectric materials. In yet another embodiment of the subject invention, hybrids of organic and inorganic materials can be used as organic low k dielectrics.

Figure 3:
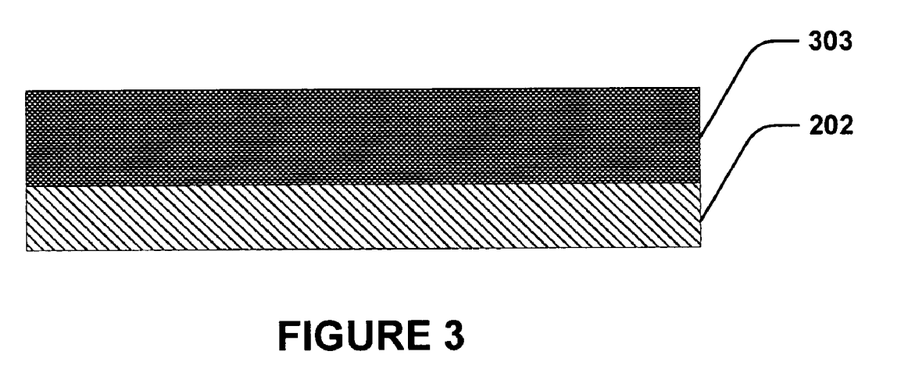

FIG. 3 is a cross sectional illustration of an organic low k dielectric layer 303 formed over the substrate 202. The organic low k dielectric layer 303 can be formed using suitable techniques. Examples of techniques that can be used include CVD, plasma deposition, plasma enhanced CVD, spin-on coating, evaporation, and the like. Optionally, the organic low k dielectric layer 303 may be subjected to curing or baking to drive off excess casting solvent and to improve adhesion to the underlying layers.

Organic low k dielectrics can be formed to a suitable thickness to facilitate proper further processing. In one embodiment of the invention, the dielectric layer has a thickness from about 100 Å to about 50,000 Å. In another embodiment of the subject invention, the organic low k dielectric layer has a thickness from about 1000 Å to about 10,000 Å. Organic low k dielectrics can cover the surface of the substrate 202, either fully or partially.

Organic low k dielectrics may be transparent, semi-transparent, or opaque. The organic low k dielectrics have a melting point or glass transition temperature that is sufficient to facilitate processing and fabrication of active semiconductor devices thereon or therein (such as forming organic semiconductor devices thereon and/or therein). In one embodiment, the organic low k dielectrics have a melting point and/or glass transition temperature that is about 125° C. or higher and about 425° C. or less. In another embodiment, the organic low k dielectrics have a melting point and/or glass transition temperature that is about 135° C. or higher and about 400° C. or less.

In some instances, some organic low k dielectrics are susceptible to the undesirable permeation of oxygen and/or moisture. In these instances, an optional moisture and/or oxygen barrier layer may be deposited on the surface of the organic low k dielectric. The optional barrier layer serves to prevent at least a portion of the moisture and/or oxygen from penetrating into the organic low k dielectric. Examples of barrier layers include silicon oxide, silicon nitride, nonconductive metal oxides such as aluminum oxide, alternative layers of metal/polymer such as aluminum/parylene or alternative inorganic low k dielectric medium/polymers such as silica/cyclotene to reduce an/or eliminate the diffusion of oxygen and moisture through the organic low k dielectric. When the alternative layers of metal/polymer are employed, the top or final layer is preferably made of insulating material to prevent any possible shorting.

Referring back to FIG. 1, act 104 of method 100 is forming a capping layer over the organic low k dielectric layer 303. Capping layers are formed to protect the organic low k dielectric layer 303 from deleterious interactions with contaminates, including moisture. Capping layers of the subject invention can be formed using suitable materials. Examples of capping materials include silicon (including polysilicon), silicon-germanium, tungsten (W), silicon oxynitride, silicon nitride, titanium, titanium nitride, tetra-ethylorthosilicate (TEOS), and the like.

Figure 4:
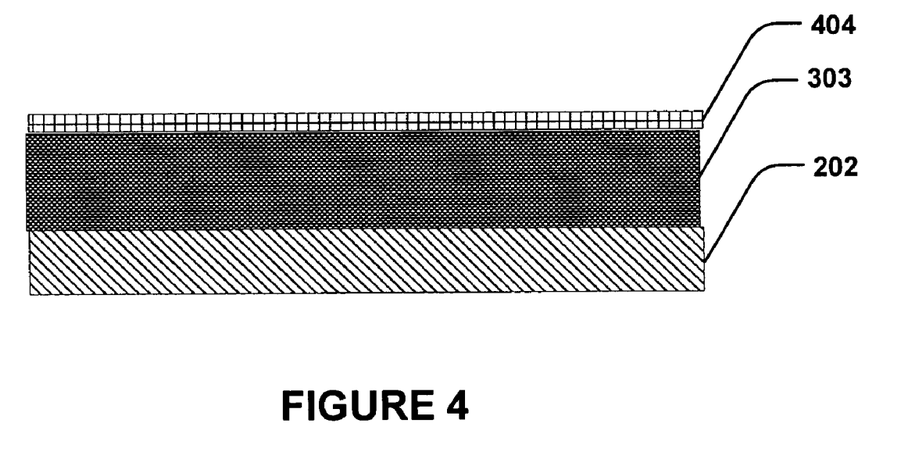

FIG. 4 shows a cross sectional illustration of a capping layer 404 formed over the organic low k dielectric layer 303. The capping layer can be a single layer or can be multiple layers. When a capping layer contains multiple layers, the layers can be made of the same material or different materials.

The capping layer 404 can be formed using any suitable technique. Examples of techniques that can be used to form capping layers include physical vapor deposition (PVD), CVD, PECVD, low pressure CVD, high pressure CVD, sputtering, evaporation, and the like.

The capping layer 404 can be formed to an appropriate thickness such that the capping layer 404 protects underlying layers during patterning procedures. In one embodiment of the subject invention, the capping layer 404 has a thickness from about 10 Å to about 5000 Å. In another embodiment of the subject invention, the capping layer 404 has a thickness from about 100 Å to about 2000 Å. In yet another embodiment of the subject invention, the capping layer 404 is formed to a thickness from about 250 Å to about 1000 Å. Optionally, additional layers such as barrier layers, hard mask layers, and etch stop layers can be formed either below or above the capping layer depending upon design needs.

Figure 5:
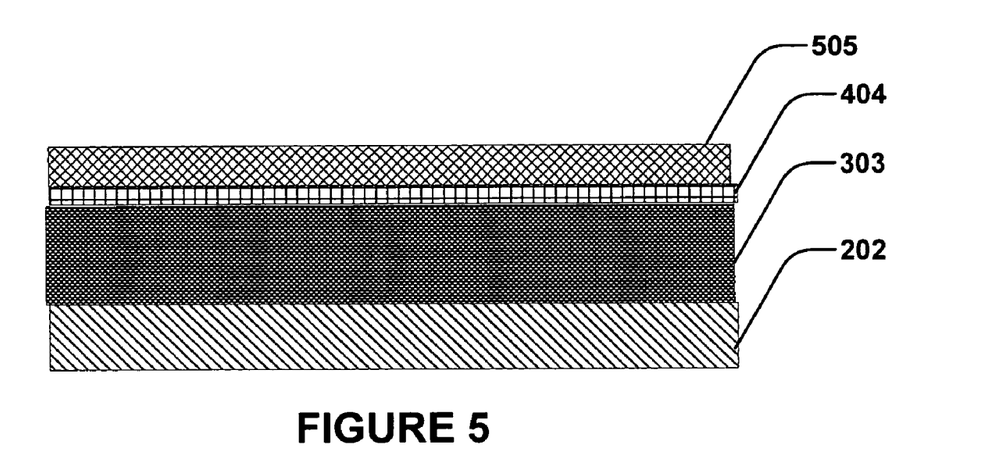

Referring back to FIG. 1, act 106 of method 100 is forming a silicon-containing resist. FIG. 5 is a cross sectional illustration of a semiconductor substrate undergoing fabrication according to method 100 showing a silicon-containing resist layer 505 formed over the capping layer 404. The silicon-containing resist layer 505 can be any resist that contains silicon in its backbone. Typically, silicon-containing resists include silicon-containing acid-sensitive polymers. Both positive and negative silicon-containing resists can be used. Any silicon-containing resist that is resistant to oxygen, hydrogen or nitrous oxide etches can be used. Any commercially available silicon-containing resist can be used. Typically, silicon-containing resists contain at least about 5% silicon. Examples of silicon-containing resists include polysiloxane and a silsesquioxane. Specific examples include poly[γ-methacryloyloxypropyltris(trimethylsiloxy)silane] or PMOTSS, plasma polymerized methylsilane (PPMS), and other radiation sensitive organo-silicon materials.

The silicon-containing resist layer 505 can be formed using suitable techniques. Examples of techniques that can be used to deposit silicon-containing resist include plasma deposition, CVD, PECVD, LECVD, evaporation, and the like. Some silicon-containing polymer resists can be deposited using spin-on coating methods.

Silicon-containing resists of the subject invention can be formed to a suitable thickness. In one example, the silicon-containing resist is deposited to a thickness ranging from 100 Å to about 25,000 Å. In another example, the silicon-containing resist has a thickness from about 1000 Å to about 15,000 Å.

The silicon-containing resist layer 505 may be subjected to hard bake at a suitable temperature to cure the resist. In one embodiment of the subject invention, the hard bake is carried out at a temperature from about 100° C. to about 200° C. In another embodiment, the hard bake is carried out at a temperature from about 120° C. to about 180° C.

Referring back to FIG. 1, act 108 of method 100 is patterning the silicon-containing resist layer 505. The silicon-containing resist layer 505 is patterned to form openings. Any suitable patterning method known to persons skilled in the art can be used to pattern silicon-containing resist. Typically, patterning involves irradiation of a portion of the resist and development. In one embodiment of the subject invention, the silicon-containing resist can be irradiated with a radiation selected from at least one of V, deep UV, electron beam, and the like. In another embodiment of the invention, the silicon-containing resist layer can be irradiated with light having a wavelength of about 248 nanometers or less. In one embodiment of the subject invention, the silicon-containing resist layer is developed using an organic solvent or a hydroxide solution. Stripping of the irradiated or non-irradiated portion (depending on the type of resist) can be performed using etching. For example, chlorine or chlorine-hydrobromide based etchants can be used for etching. Patterning creates openings in the silicon-containing resist exposing portions of the underlying layers.

Figure 6:
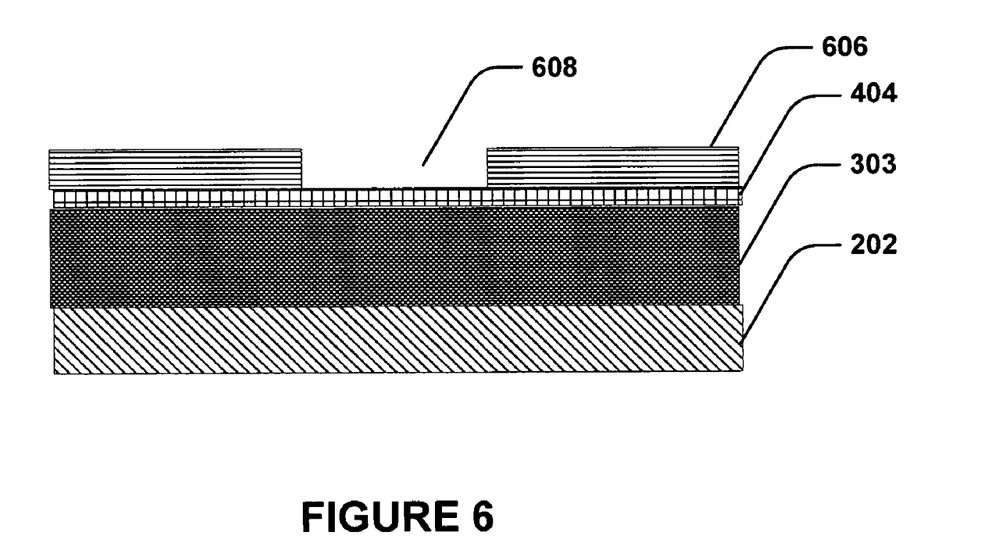

After or during patterning, the irradiated or non-irradiated portions of the silicon-containing resist layer 505 that are selected to remain after patterning are oxidized to form a patterned silicon oxide layer. In one instance, the silicon oxide layer is formed because of a reaction between the silicon in the silicon-containing resist and the plasma used to remove the irradiated or non-irradiated portion of the silicon-containing resist layer 505. The silicon oxide layer can then act as a hard mask during etching of capping and organic low k dielectric layers. Optionally, the oxidation of silicon-containing resist layer can be carried out in a process independent of patterning. Any suitable method can be used to oxidize selected portions of the silicon-containing resist layer. FIG. 6 is a cross sectional illustration of a semiconductor substrate undergoing fabrication according to one embodiment of act 108 of method 100 showing an opening 608 formed in the silicon-containing resist exposing a portion of the capping layer 404 and a silicon oxide layer 606.

Referring back to FIG. 1, act 110 of method 100 is forming one or more openings in the organic low k dielectric layer 303. After patterning the silicon-containing resist layer 505 which exposes a portion of the underlying capping layer 404, the exposed portion of the capping layer 404 is removed using the patterned silicon oxide layer 606 as a mask to expose a portion of the organic low k dielectric layer 303. The removal of the exposed portion of the capping layer can be carried out using any suitable technique, including etching. For example, the removal of the exposed portions of the capping layer 404 can be performed using a fluorine based plasma. The etching of the exposed portions of the capping layer 404 exposes a portion of the underlying organic low k dielectric layer 303. The etching of the capping layer can be anisotropic.

Figure 7:
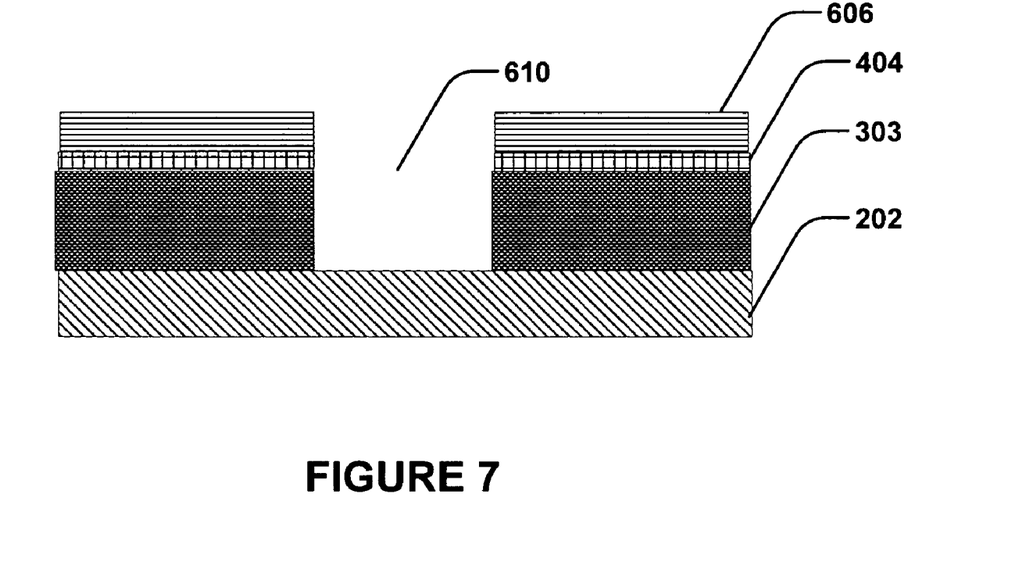

The exposed portions of the organic low k dielectric layer can be removed using suitable methods known to persons skilled in the art. For example, the organic low k dielectric layer 303 can be etched using etchants such as oxygen containing plasma. The etching of the organic low k dielectric layer can be anisotropic. In one embodiment of the subject invention, the etching is carried out in such a way as to expose a portion of a surface of the underlying substrate 202 on which the organic low k dielectric layer 303 is formed. Etching results in the formation of an opening in the dielectric. Optionally, after etching the resulting structure can be subjected to washing or cleaning procedures. FIG. 7 is a cross sectional illustration of a semiconductor substrate undergoing fabrication according to method 100 showing an opening 610 in the organic dielectric layer 303 contacting a portion of the substrate 202.

Figure 8:
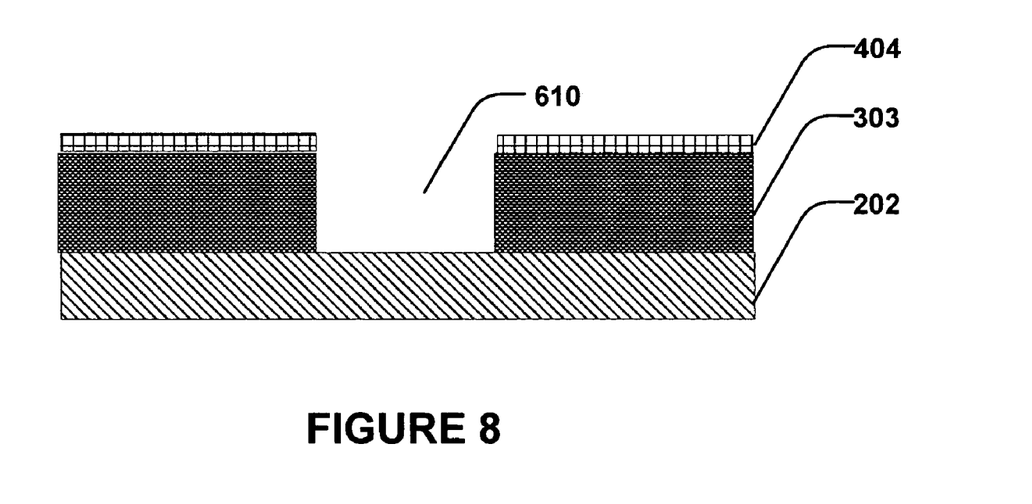

Referring back to FIG. 1, act 112 of method 100 is removing the patterned silicon oxide layer 606. The patterned silicon oxide layer 606 can be removed using any suitable method that is highly selective of the silicon oxide. In one embodiment of the subject invention, the patterned silicon oxide layer 606 can be removed using a suitable etching method. The etching can involve a dry etch or a wet etch. Dry etching may include plasma etching, reactive ion etching, and the like. The plasma etch can use a suitable etchant. Examples of etchants include fluorine and oxygen containing plasma generated using gases such as $CF_4$, $CHF_3$, $CH_2F_2$, $SO_2$, $N_2O$, and $CO$. In another embodiment of the subject invention, the patterned silicon oxide layer can be removed by immersing in a wet compound such as hydrofluoric acid. In yet another embodiment, the patterned silicon oxide layer can also be removed by polishing. Any suitable polishing method can be used to remove silicon oxide. During the removal of the patterned silicon oxide layer 606, some portion of the capping layer 404 may be lost. FIG. 8 is a cross sectional illustration of a semiconductor substrate undergoing fabrication according to method 100 showing an opening 610 in the organic dielectric layer 505 after removal of the patterned silicon oxide layer.

Although, the subject invention is described above using a single layer resist lithography process, it should be appreciated that the subject invention can also be employed advantageously in photolithography processes employing bilayer and multilayer resist processes.

Figure 9:
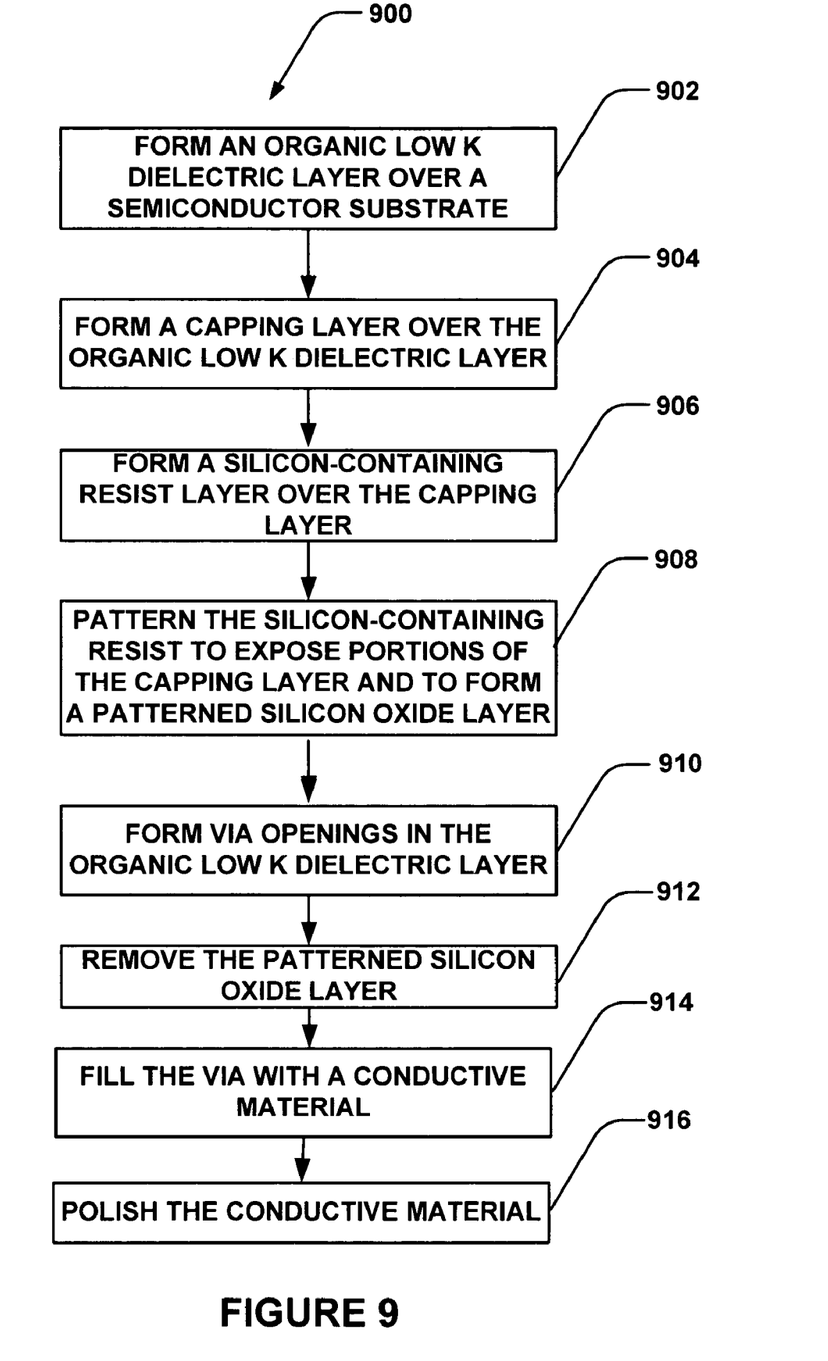
FIG. 9 is a flow chart depicting an exemplary methodology according to one aspect of the subject invention fabricating damascene interconnect structures.

Referring to FIG. 9, a flow chart of an exemplary methodology 900 to fabricate a damascene interconnect structure according to one aspect of the subject invention is illustrated. Method 900 involves forming an organic low k dielectric material over a semiconductor substrate (act 902), forming a capping layer over the organic low k dielectric layer (act 904), forming a silicon-containing resist layer over the capping layer (act 906), patterning the resist to expose portions of the capping layer and to form a patterned silicon oxide layer (act 908), etching one or more openings in the exposed portions of the capping layer and corresponding portions of the organic low k dielectric layer underlying the exposed portions of the capping layer (act 910), removing the patterned silicon oxide layer (act 912), filling the via openings with a conductive metal (act 914) and polishing the conductive metal to form a damascene structure (act 916).

Acts 902-912 of method 900 are similar to acts 102-112 of method 100, and result in a structure shown in FIG. 8. The structure of FIG. 8 shows an opening 610 formed in the organic low k dielectric layer 505. For purposes of brevity, the details of these acts are not repeated here. The opening 610 in context of a damascene interconnect structure represents a via. In one embodiment of the subject invention, act 902 involves forming an organic low k dielectric layer over an existing interconnect line formed on a substrate.

In one embodiment of the subject invention, a diffusion barrier layer may be formed over the via openings. The diffusion barrier layer may be formed such that the capping layer 404, the sidewalls of the via, and the bottom surfaces of the via openings are all covered with the diffusion barrier layer. The diffusion barrier layer is formed before deposition of a conductive material. Any suitable metal can be used to form the diffusion barrier. Examples of barrier metals include titanium, titanium nitride, tantalum, tantalum nitride, or any combination thereof. In one embodiment of the subject invention, tantalum (Ta) is used as the diffusion barrier. In another embodiment of the subject invention, compounds or alloys containing Ta are used as the diffusion barrier. Examples include tantalum oxide, tantalum chloride, tantalum bromides, tantalum sulfide, tantalum nitride and the like.

The diffusion barrier layer can be formed by any suitable method. For example, the diffusion barrier layer can be formed by deposition techniques such as CVD, PVD, PECVD, LPCVD, sputtering, evaporation, or electroplating.

The thickness of the diffusion barrier layer is controlled. For example, in one embodiment of the subject invention, the diffusion barrier layer can have a thickness from about 1 Å to about 200 Å. In another embodiment, the thickness of the diffusion barrier layer is from about 5 Å to about 50 Å. In yet another embodiment of the subject invention, the diffusion barrier layer has a thickness of about 20 Å.

Figure 10:
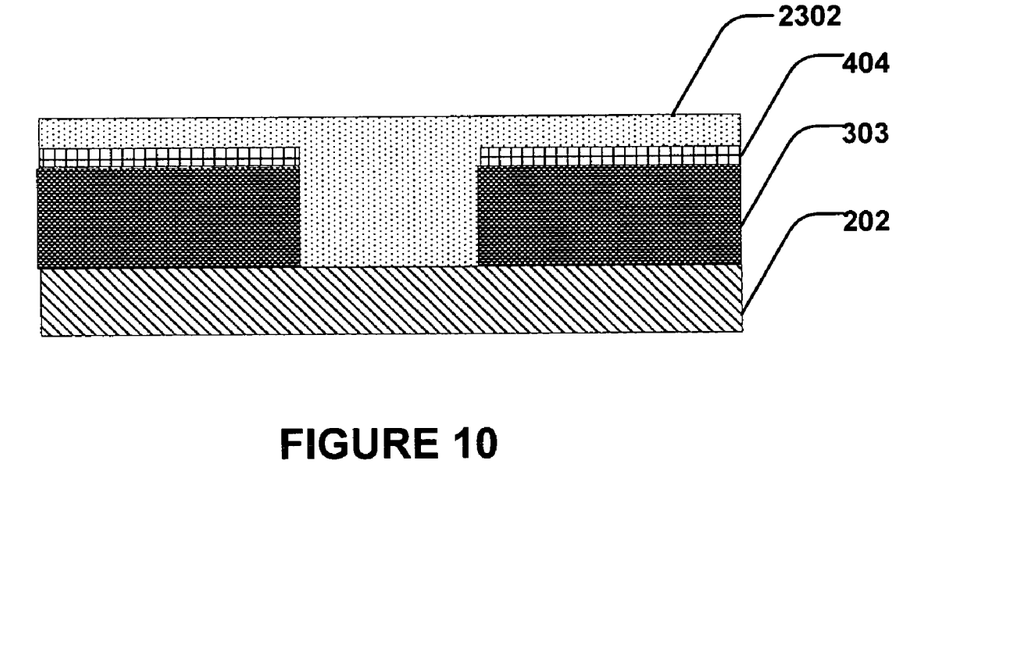
FIGS. 10 and 11 are cross sectional views of a semiconductor substrate undergoing fabrication according to one aspect of the subject invention to form a damascene interconnect structure.

Act 914 of method 900 is filling the via openings with a conductive metal. FIG. 10 shows a cross sectional illustration of a conductive material layer 2302 in a via undergoing fabrication in accordance with one aspect of the subject invention. Any suitable conductive material can be used to fill the vias. For example, the conductive 10Q materials may include conductive metals, conductive metal alloys, conductive metal oxides, and the like. Specific examples of conductive materials include one or more of aluminum, chromium, copper, germanium, gold, magnesium, manganese, indium, iron, nickel, palladium, platinum, silver, titanium, zinc, and alloys thereof. Alloys specifically include Hastelloy®, Kovar®, Invar, Monel®, Inconel®, brass, stainless steel, magnesium-silver alloy, and various other alloys.

The conductive material layer 2302 is formed using standard depositing techniques. For example, CVD, PVD, PECVD, evaporation, sputtering, atomic layer deposition and the like can be used. In one embodiment of the subject invention, a seed layer of a metal is formed at the bottom of a via. This seed layer is typically from about 1000 Å to about 3000 Å in thickness and is either a pure metal or a metal alloy. The seed layer is formed using techniques such as CVD. In one embodiment, the seed layer may also interact with previously deposited barrier layer. After formation of the seed layer, the metal layer is completed by depositing additional metal using electroplating and/or blanket deposition. The additional metal may be either a pure metal or an alloy.

Figure 11:
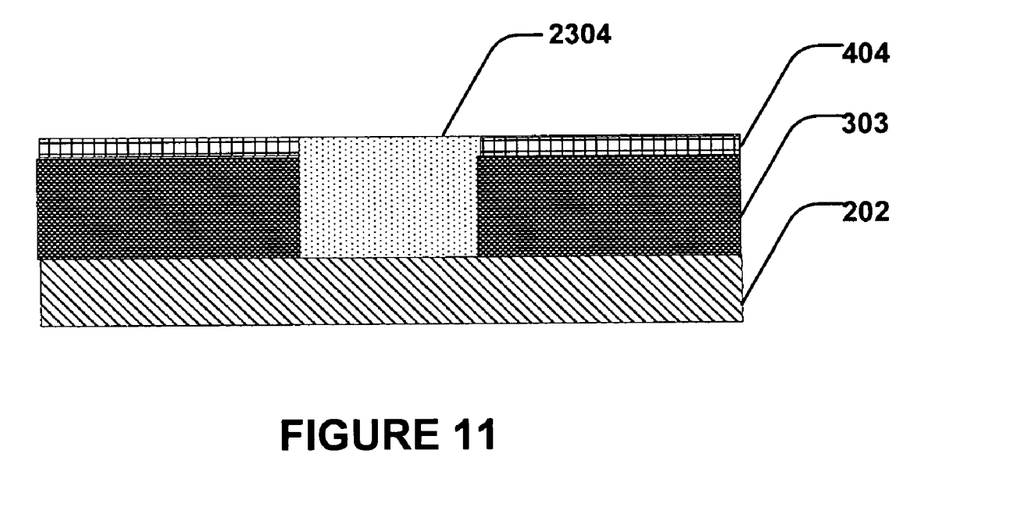

Referring back to FIG. 9, act 916 of method 900 is polishing the conductive material to result in a damascene interconnect structure. The polishing can be performed by any suitable technique. For example, chemical mechanical polishing can be used to polish the conductive material. The conductive material layer is polished to the top of the dielectric layer. FIG. 11 is a cross sectional illustration of a semiconductor substrate undergoing fabrication according to method 900 showing a polished conductive material layer 2304. The damascene structure obtained using method 900 can be employed in further processing to complete fabrication of desired semiconductor devices. In one embodiment, the polishing may also remove the capping layer 404 either completely or partially.

Figure 12:
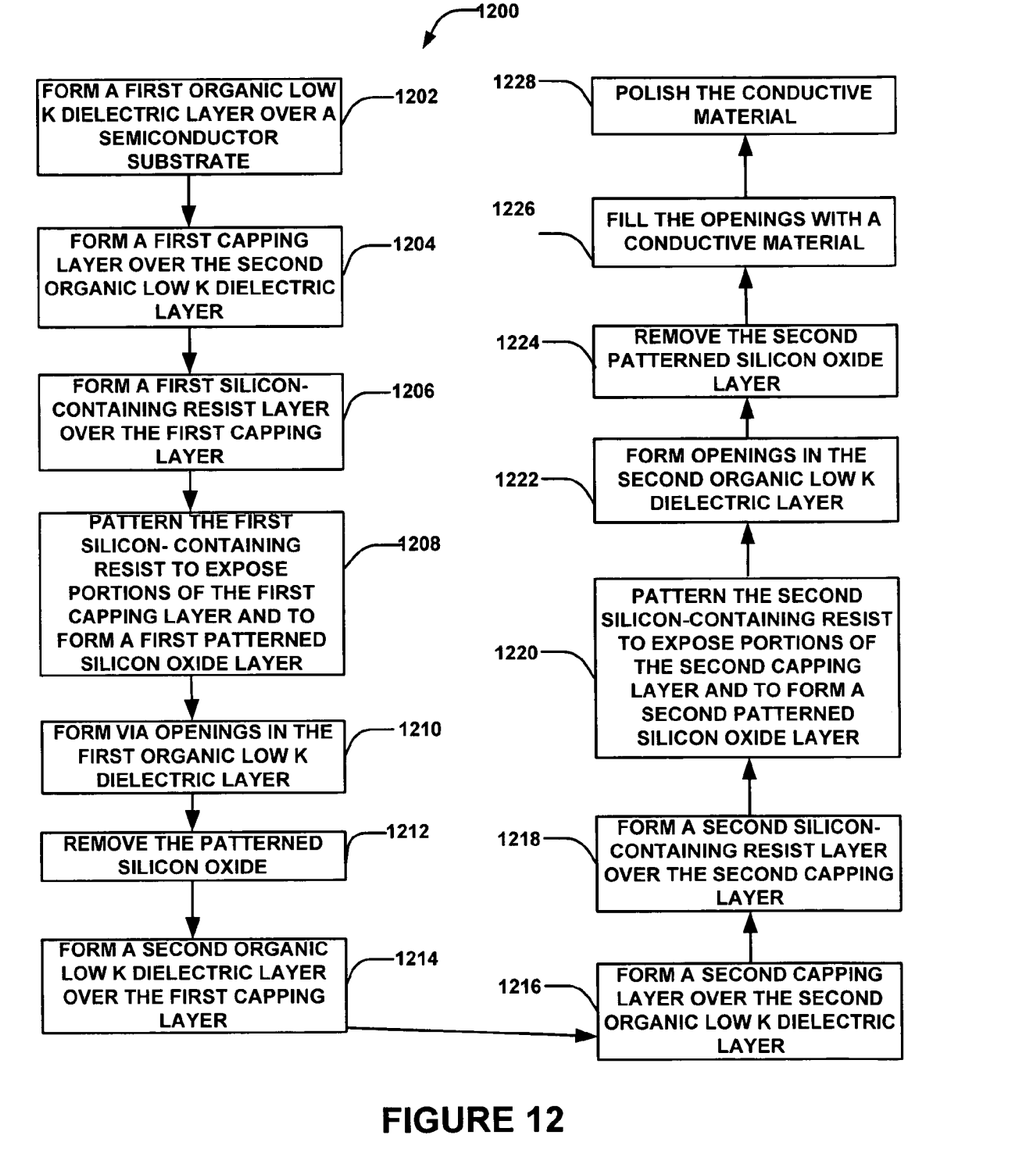
FIG. 12 is a flow chart depicting an exemplary methodology according to one aspect of the subject invention fabricating dual damascene interconnect structures.

Referring to FIG. 12, a flow chart of an exemplary methodology 1200 to fabricate a dual damascene structure according to one aspect of the subject invention is illustrated. Method 1200 involves forming a first organic low k dielectric layer over a semiconductor substrate (act 1202), forming a first capping layer over the dielectric layer (act 1204), forming a first silicon-containing resist layer over the first capping layer (act 1206), pattering the first silicon-containing layer to expose portions of the underlying capping layer and to form a first patterned silicon oxide layer (act 1208), forming via openings in the first dielectric layer (act 1210), removing the first patterned silicon oxide layer (act 1212), forming a second organic low k dielectric layer over the first capping layer covering the via openings (act 1214), forming a second capping layer over the second organic low k dielectric layer (act 1216), forming a second silicon-containing resist layer over the second capping layer (act 1218), patterning the second silicon-containing layer to expose portions of the second capping layer and to form a second patterned silicon oxide layer (act 1220), forming trench openings in the second organic low k dielectric layer (act 1222), removing the second patterned silicon oxide layer (act 1224), filling the openings with a conductive material (act 1226), and polishing the conductive material to form a dual damascene interconnect structure (act 1228).

Acts 1202-1212 of method 1200 are similar to acts 102-112 of method 100, and therefore not repeated here. Act 1212 results in a structure as shown in FIG. 8. The structure of FIG. 8 shows an opening 610 formed in an organic low k dielectric layer 303. The opening 610 in the context of dual damascene interconnects can be a via. Optionally, the first organic low k dielectric layer can be formed over a bottom etch stop layer formed over an existing interconnect pattern, such as a metal line formed on a semiconductor substrate. The bottom etch stop layer can be formed using methods and materials known to persons skilled in the art. The bottom etch stop layer serves to protect underlying interconnect layers from over etching during patterning.

Figure 13:
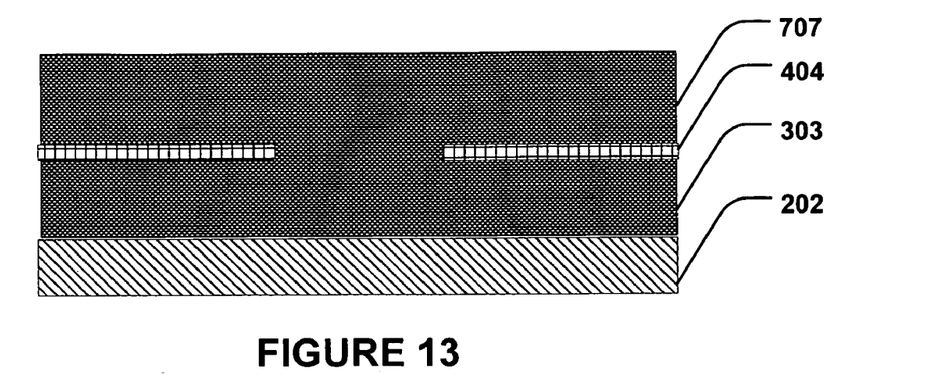
FIGS. 13-17 are cross sectional views of a semiconductor substrate undergoing fabrication according to one aspect of the subject invention to form a dual damascene interconnect structure.

Act 1214 of method 1200 is forming a second organic low k dielectric layer over the structure resulting from act 1212. FIG. 13 is a cross sectional illustration of a semiconductor substrate undergoing fabrication according to method 1200 showing a second organic low k dielectric layer 707. The second organic low k dielectric layer 707 can be the same or different from the first organic low k dielectric layer 303. The second organic low k dielectric layer 707 substantially covers the via openings. The second organic low k dielectric layer 707 can be formed using deposition techniques described for act 102 of method 100. The second organic low k dielectric layer is deposited to a suitable thickness. The thickness of the second organic low k dielectric material layer can be from about 1000 Å to about 50,000 Å. Optionally, the second organic low k dielectric layer can be cured before forming additional overlying layers. In one embodiment of the subject invention, the first silicon oxide layer is not removed before forming a second organic low k dielectric layer. Also, additional layers such as adhesion improving layers, barrier layers, mask layers and etch stop layers may be formed prior to depositing the second organic low k dielectric layer.

Figure 14:
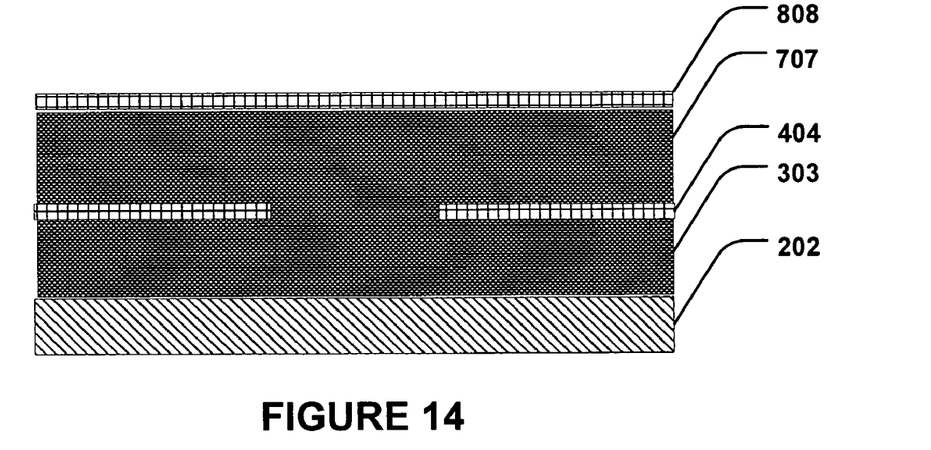

Act 1216 of method 1200 is forming a second capping layer 808 over the second organic low k dielectric layer 707. The second capping layer 808 can be formed using the same methods and materials used for the first capping layer. The second capping layer 808 serves as a stop layer during formation of trenches. FIG. 14 is a cross sectional illustration of a semiconductor substrate undergoing fabrication according to method 1200 showing a second capping layer 808 over the second organic low k dielectric layer 707.

Figure 15:
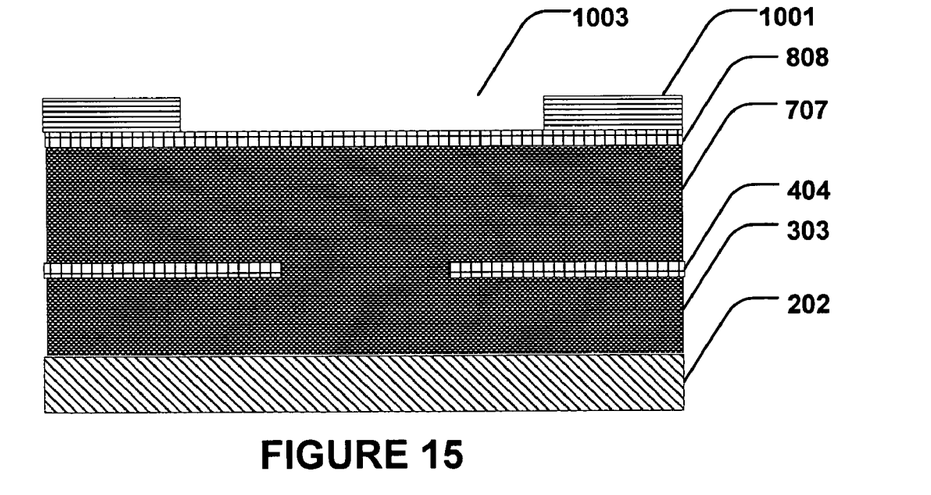

Referring back to FIG. 12, acts 1218 and 1220 of method are similar to acts 106 and 108 of method 100, and therefore can be adapted with or without changes. FIG. 15 is a cross sectional illustration of a semiconductor substrate undergoing fabrication according to method 1200 showing a structure resulting from act 1220. FIG. 15 shows a second patterned silicon oxide layer 1001 and an opening 1003 patterned in the second silicon-containing resist layer.

Figure 16:
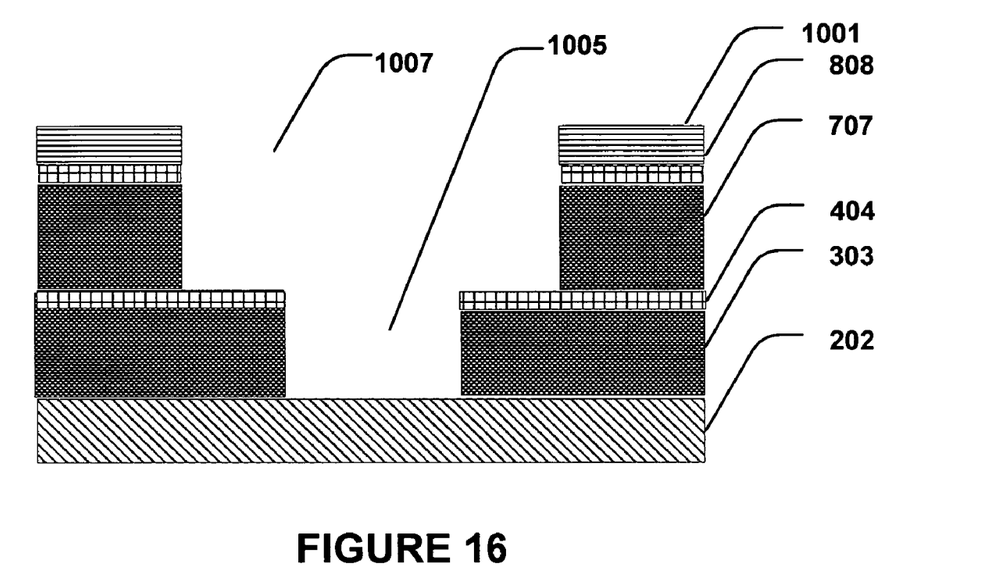

Act 1222 of method 1200 is forming trenches in the second organic low k dielectric layer 707 using the second patterned silicon oxide layer 1001 as a mask layer. Act 1222 is similar to act 110 of method 100. The trenches can be formed using any suitable technique including etching. The trenches can be etched using dry etching processes such as plasma etching and reactive ion etching. Any suitable etchant can be used to etch trenches. For example, oxygen based etchants can be used. Etching is performed in such a way that trenches align over the via openings. During etching of the trenches, the dielectric material from vias is also simultaneously etched, resulting in the formation of both vias and trenches in the same act. FIG. 16 is a cross sectional illustration of a semiconductor substrate undergoing fabrication according to method 1200 showing a via 1005 and a trench 1007 formed in organic low k dielectric layers.

Referring back to FIG. 12, act 1224 is removing the second patterned silicon oxide layer from the second capping layer. Act 1224 of method is similar to act 112 of method 100, and therefore can be adapted with or without changes.

Referring back to FIG. 12, acts 1226 and 1228 are filling a conductive material in the via and trench openings and polishing the conductive material, respectively. Acts 1226 and 1228 of method 1200 are similar to acts 914 and 916 of method 900 except that in method 1200 conductive material is filled to substantially cover both trenches and vias.

Figure 17:
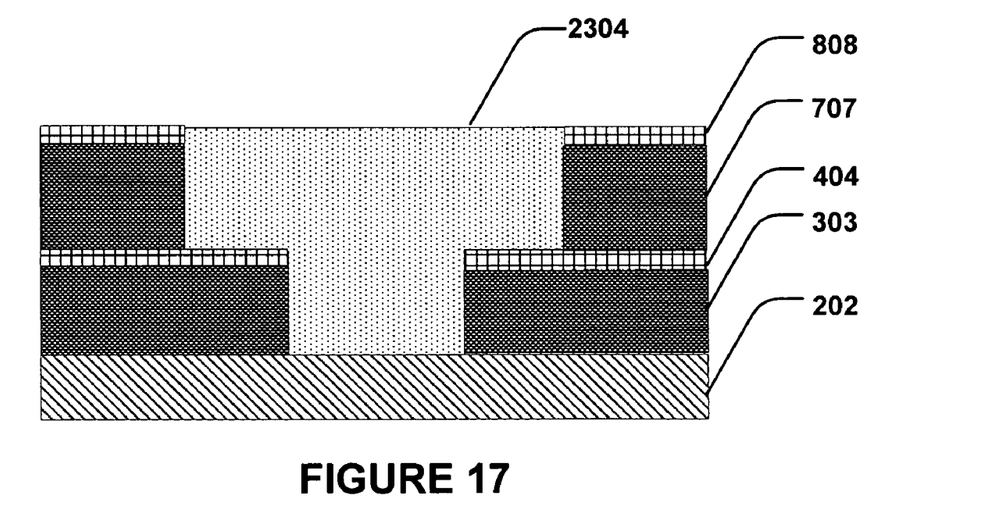

In one embodiment of the subject invention, a barrier layer is formed before filling the openings with a conductive material. FIG. 17 is a cross sectional illustration of a semiconductor substrate undergoing fabrication according to method 1200 showing a polished conductive material layer 2304 in the openings.

Although, method 1200 is described using two organic low k dielectric layers to form a dual damascene structure, it is to be appreciated that persons skilled in the art can adapt the subject invention to include use of two different dielectric layers to fabricate a dual damascene structure. For example, a dual damascene structure can be formed in which one dielectric layer is formed using a high k dielectric material whereas the other dielectric layer is formed using an organic low k dielectric material. In another example, a dual damascene structure can be formed in which one dielectric is formed using any low k dielectric material whereas the second dielectric material is formed using an organic low k dielectric material. Therefore, use of different dielectric layers to fabricate dual damascene structures is within the scope of the subject invention.

The subject invention is described using one particular method of forming a dual damascene structure. However, it is to be noted that dual damascene structures can be formed in a number of ways. For example, dual damascene structures can be formed using a trench-first dual damascene approach, a via-first dual damascene approach, and a self-aligned dual-damascene approach. The subject invention can be used advantageously with dual damascene structures formed in any manner. Therefore, dual damascene structures formed with other known methods are within the scope of the subject invention. Further, persons skilled in the art appreciate that the subject invention can be applied wherever organic low k dielectrics can be integrated into the manufacture of semiconductor and microelectronic devices.

The methods of the subject invention may be used advantageously with any semiconductor technology including but not limited to NMOS, PMOS, CMOS, BiCMOS, bipolar, multi-chip modules (MCM) and other semiconductors. For example, the subject invention can be useful in the manufacture of computers, appliances, industrial equipment, hand-held devices, telecommunications equipment, medical equipment, research and development equipment, transportation vehicles, radar/satellite devices, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of patterning organic low k dielectric layers, comprising:
   forming an organic low k dielectric layer over a semiconductor substrate;
   forming a capping layer over the organic low k dielectric layer to protect the organic low k dielectric layer from moisture;
   forming a silicon-containing resist layer over the capping layer;
   patterning the silicon-containing resist layer to expose portions of the capping layer;
   oxidizing the patterned silicon-containing resist layer to form a patterned silicon oxide layer;
   removing the exposed portions of the capping layer and portions of the organic low k dielectric layer underlying the exposed portions of the capping layer to form one or more openings; and
   removing the patterned silicon oxide layer.

2. The method of claim 1, wherein the organic low k dielectric layer comprises at least one selected from the group consisting of polyimides, fluorinated polyimides, polysilsequioxanes, methyl polysilsequioxanes, butyl polysilsequioxanes, phenyl polysilsequioxanes, benzocyclobutenes, fluorinated benzocyclobutenes, polyphenylenes, polyphenylquinoxalines, copolymers of 2,2-bistrifluoromethyl-4,5-difluoro-1,3-dioxole, perfluoroalkoxy resins, fluorinated ethylene propylenes, fluoromethacrylates, poly(arylene ethers), fuorinated poly(arylene ethers), fluorinated parylenes, poly(p-xylxylenes), fluorinated poly(p-xylxylenes), parylene F, parylene N, parylene C, parylene D, amorphous polytetrafluoroethylenes, polyquinolines, polyvinylidinefluorides, and polyphenylquinoxalines.

3. The method of claim 1, wherein the organic low k dielectric layer is formed using spin-on coating techniques.

4. The method of claim 1, wherein the organic low k dielectric layer has a thickness from about 100 Å to about 50,000 Å.

5. The method of claim 1, wherein the patterned silicon oxide layer is formed during patterning the silicon-containing resist layer.

6. The method of claim 1, wherein the capping layer comprises one or more selected from the group consisting of silicon, silicon-germanium, tungsten, silicon oxynitride, silicon nitride, titanium, titanium nitride, and tetraethylorthosilicate.

7. The method of claim 1, wherein the silicon-containing resist layer comprises at least one of a polysiloxane and a silsesquioxane.

8. The method of claim 1, wherein the silicon-containing resist layer is formed by spin-on techniques.

9. The method of claim 1, wherein pattering the silicon-containing resist layer comprises irradiating the silicon-containing resist layer with light having a wavelength of about 248 nanometers or less.

10. The method of claim 1, wherein the silicon-containing resist layer is patterned using at least one of an organic solvent and a hydroxide solution.

11. The method of claim 1, wherein removing the portions of the organic low k dielectric layer comprises a plasma etching.

12. The method of claim 1, wherein removing the portions of the organic low k dielectric layer comprises contacting with an oxygen containing plasma.

13. The method of claim 1, wherein removing the patterned silicon oxide layer comprises at least one of etching and polishing.

14. The method of claim 1, further comprising filling the openings with a conductive material and polishing the conductive material to form an interconnect structure.

15. The method of claim 14, further comprising forming a barrier layer over sidewalls and bottom surfaces of the openings before filling the openings with the conductive material.

16. A method for forming a damascene interconnect structure using organic low k dielectric materials, comprising:
   forming an organic low k dielectric layer over a semiconductor substrate;
   forming a capping layer over the organic low k dielectric layer to protect the organic low k dielectric layer from moisture;
   forming a silicon-containing resist layer over the capping layer;
   patterning the silicon-containing resist layer to expose portions of the capping layer;
   oxidizing portions of the patterned silicon-containing resist layer to form a patterned silicon oxide layer;
   removing the exposed portions of the capping layer and portions of the organic low k dielectric layer underlying the exposed portions of the capping layer to form one or more via openings;
   removing the patterned silicon oxide layer;
   filling the one or more via openings with at least one conductive material; and
   polishing the conductive material.

17. The method of claim 16, further comprising forming the organic low k dielectric layer over an existing interconnect line on a semiconductor substrate.

18. A method for forming a dual damascene interconnect structure using organic low k dielectric materials, comprising:

forming a silicon-containing resist layer over a capping layer overlying an organic low k dielectric layer, the capping layer to protect the organic low k dielectric layer from moisture;

patterning the silicon-containing resist layer to expose portions of the capping layer and to form a patterned silicon oxide layer;

forming one or more openings in portions of the organic low k dielectric layer underlying the exposed portions of the capping layer;

removing the patterned silicon oxide layer;

filling the openings with one or more conductive materials; and polishing the conductive materials.

19. The method of claim 18, wherein the openings comprise one or more of vias and trenches.

20. The method of claim 18, further comprising forming a barrier layer over the via and the trench openings.

* * * * *